United States Patent [19]  [11] Patent Number: 4,751,191
Gonsiorawski et al.  [45] Date of Patent: Jun. 14, 1988

[54] METHOD OF FABRICATING SOLAR CELLS WITH SILICON NITRIDE COATING

[75] Inventors: Ronald C. Gonsiorawski, Danvers; George Czernienko, Lowell, both of Mass.

[73] Assignee: Mobil Solar Energy Corporation, Billerica, Mass.

[21] Appl. No.: 71,018

[22] Filed: Jul. 8, 1987

[51] Int. Cl.$^4$ ............................................. H01L 31/18
[52] U.S. Cl. ........................................... 437/2; 437/4; 437/18; 437/46; 437/241; 437/980; 136/256; 136/258
[58] Field of Search ...................... 437/2, 4, 10, 12, 18, 437/46, 189, 194, 197, 203, 229, 230, 241, 937, 980; 136/256, 258 PC

[56] References Cited
U.S. PATENT DOCUMENTS 4,451,969  6/1984  Chaudhuri ............................... 437/2
4,608,097  8/1986  Weinberger ......................... 148/33.3
4,640,001  2/1987  Koiwai et al. ............................ 437/2

Primary Examiner—Aaron Weisstuch
Attorney, Agent, or Firm—Schiller, Pandiscio & Kusmer

[57] ABSTRACT

A process of manufacturing silicon solar cells with efficiencies of between about 12.5% and about 16.0% is described, the method being characterized by forming a P/N junction adjacent the front surface of a silicon substrate, subjecting the front surface of the substrate to a selected plasma surface etch treatment, and then forming a polysilazane coating on the etched front surface by (a) first subjecting the substrate to an ammonia plasma treatment for a predetermined period of time so as to produce hydrogen implantation and (b) subjecting the subtrate to a silane and ammonia plasma treatment to obtain additional hydrogen implantation and formation of a polysilazane (hydrogenated silicon nitride) coating. The polysilazane coating is etched to form a grid electrode pattern. An aluminum coating is applied to the rear side of the substrate so as to form a back electrode. The aluminum coating is heated so as to alloy with the silicon substrate and thereby form an ohmic contact. The alloying step also densifies the polysilazane so that it is more nearly silicon nitride. The exposed silicon on the front side of the substrate is coated with an adherent coating of a highly conductive metal so as to form a grid electrode.

17 Claims, 1 Drawing Sheet

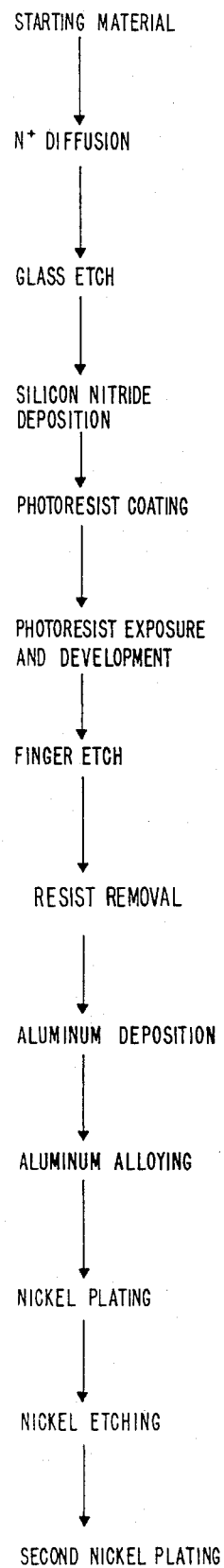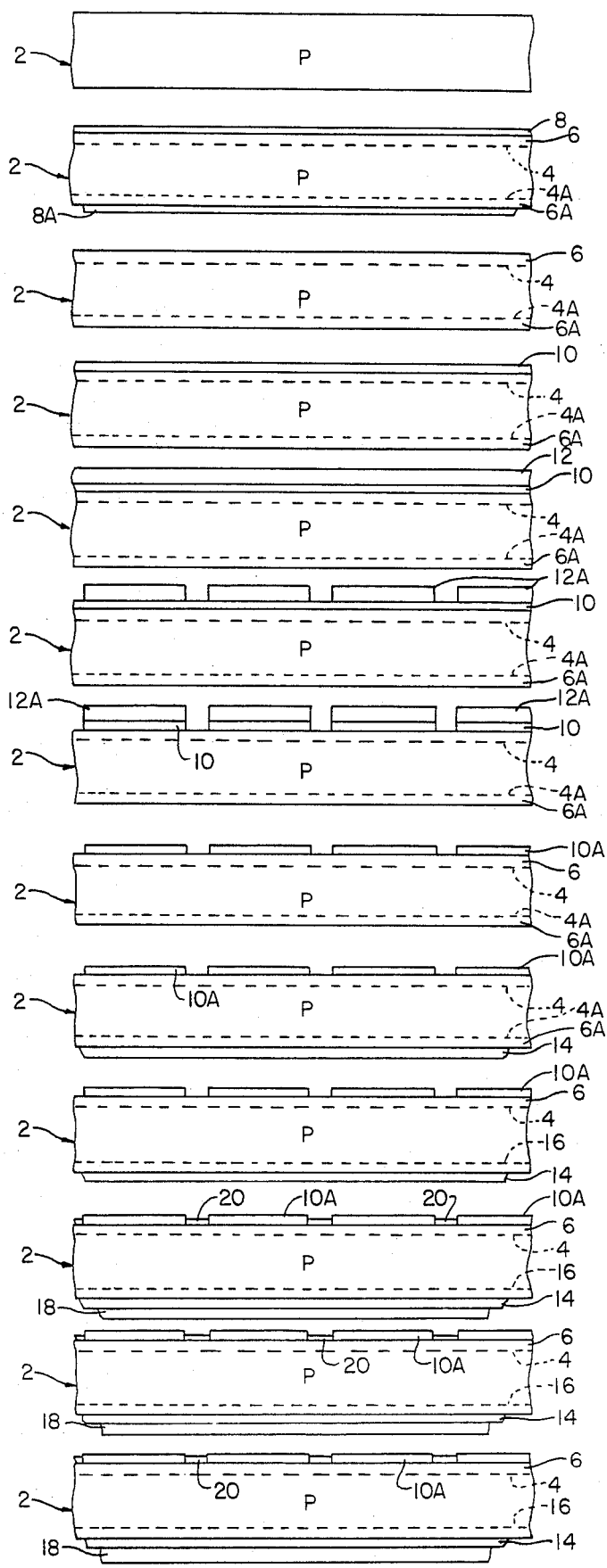

METHOD OF FABRICATING SOLAR CELLS WITH SILICON NITRIDE COATING

This invention pertains to the manufacture of photovoltaic cells and more particularly to an improved method of fabricating silicon solar cells so as to enhance solar cell energy conversion efficiency.

PRIOR ART

U.S. Pat. No. 4,451,969, issued June 5, 1984 to Arup R. Chaudhuri for "Method of Fabricating Solar Cells", discloses a method of making semiconductor solar cells in which a layer of silicon nitride serves as a mask for metallization and also as an anti-reflection coating. A similar process is described in U.S. Pat. No. 4,640,001, issued Feb. 3, 1987 to Sakae Koiwai et al. for "Solar Cell Manufacturing Method".

The Chaudhuri patent describes various steps pertaining to the manufacture of solar cells, including (1) formation of a shallow junction by phosphine diffusion in a silicon substrate, (2) formation of a "polysilazane" coating on the silicon substrate, (3) use of controlled heating to rapidly and efficiently accomplish (a) removal of photoresist used for the formation of grid electrode patterns by photolithography, and (b) conversion of the polysilazane to a substance that is more nearly silicon nitride ($Si_3N_4$) and has a substantially reduced etch rate, (4) application of an aluminum coating to the rear side of the substrate, and (5) heating the substrate so as to cause the aluminum to alloy with the silicon substrate so as to form an adherent ohmic contact.

OBJECTS AND SUMMARY OF THE INVENTION

A primary object of the invention is to provide a new method of fabricating silicon solar cells that improves upon the methods disclosed in U.S. Pat. Nos. 4,451,969, and 4,640,001.

A more specific object of this invention is to provide an improved method for making photovoltaic semiconductor junction devices in which a silicon nitride-containing coating serves both as a mask to permit selective plating of a predetermined grid-shaped electrode on one side of the device and also as an anti-reflection coating.

Another object is to provide an improved method of manufacturing polycrystalline solar cells having an overall cell efficiency of about 12.5 to 16.0%, with the cells being characterized by an adherent silicon nitride anti-reflection coating created by a plasma CVD process at a relatively high temperature.

A further object of the invention is to provide an improved method of making silicon solar cells in which steps are provided for deposition of a silicon nitride layer so that the latter will withstand separation when the solar cell is subjected to a aluminum alloying treatment.

Still another object of the invention is to improve upon the method of producing solar cells that comprises (1) formation of a polysilazane (a form of silicon nitride) coating by (a) an ammonia plasma treatment that produces hydrogen implantation and (b) a combined silane and ammonia plasma treatment for obtaining additional hydrogen implantation and formation of a thin polysilazane coating, (2) etching the polysilazane coating to form a grid pattern, (3) coating the back surface of the substrate with an aluminum coating, and (4) heating the substrate so as to alloy the aluminum and densify the polysilazane coating.

The foregoing objects are achieved by subjecting the substrate to a selected plasma surface treatment that improves adhesion of the polysilazane coating to the silicon substrate and prevents portions of the silicon nitride layer from popping or acquiring pinholes during the aluminum alloying step. The occurrence of popping or pinholes has an adverse effect on the conversion efficiency since it is caused by outgassing of hydrogen. More specifically, the foregoing objects are achieved by a process which in its preferred embodiment as applied to the manufacture of silicon solar cells, involves, inter alia, the following steps: (1) forming a shallow junction on the front side of the silicon substrate with the consequential production of an insulating layer (a phosphorus glass) on that front surface of the substrate; (2) removing the insulating layer from the substrate (3) subjecting the front surface of the substrate to a plasma etch so as to remove some of the substrate material uniformly across the full expanse of the front surface; (4) forming on the front surface of the substrate a silicon and nitrogen-containing coating having a relatively high etch rate by (a) first subjecting the substrate to an ammonia plasma treatment for a predetermined period of time so as to produce hydrogen implantation and (b) then subjecting the substrate to a silane and ammonia plasma treatment to obtain additional hydrogen implantation and formation of a polysilazane (hydrogenated silicon nitride) coating; (5) etching a grid electrode pattern in the polysilazane coating; (6) applying an aluminum coating to the back surface of the substrate; (7) heating the substrate so as to alloy the aluminum with the silicon substrate; and (8) plating the aluminum coating and also the exposed silicon on the front side of the substrate with an adherent coating of a highly conductive solderable metal (e.g., nickel).

The ammonia plasma treatment has the effect of enhancing the conversion efficiency of the solar cell by virtue of diffusion of hydrogen into the substrate. The heat treatment for alloying the aluminum tends to cause the implanted hydrogen to diffuse further into the substrate, thereby beneficially altering the bulk diffusion length characteristics of the substrate so as to decrease recombination of the minority carriers produced in response to the incident light. The alloying heat treatment also densifies the polysilazane coating so that it is more nearly silicon nitride. The alloying heat treatment also tends to drive the hydrogen out of the substrate via the front surface. This outgassing of hydrogen sometimes causes the silicon nitride coating to pop, i.e., form bubbles, or to acquire pinholes, with the result that the conversion efficiency of the cell is lowered.

The plasma surface etch improves adhesion of the subsequent polysilazane coating in that it eliminates any tendency of that coating to pop, i.e., form bubbles, or to acquire pinholes when the substrate is heated to alloy the aluminum.

BRIEF DESCRIPTION OF THE DRAWINGS

Other features and advantages of the invention are described or rendered obvious by the following detailed description which is to be considered together with the accompanying drawing which illustrates the steps involved in making solar cells according to a preferred form of the invention. In the drawing, the thicknesses and depths of the several coatings and regions are not shown exactly in accordance with their relative proportions, for convenience of illustration and description.

DETAILED DESCRIPTION OF THE INVENTION

Prior to this invention it had been discovered by Arup Chaudhuri and K. V. Ravi (see copending PCT Application Ser. No. 01/701622, filed on even date herewith) that it is possible to enhance the conversion efficiency of silicon photovoltaic solar cells of the type comprising a silicon substrate having a P/N junction and a silicon nitride anti-reflection coating by sequentially (a) first subjecting the substrate to an ammonia plasma treatment at a selected temperature for a time sufficient to produce hydrogen implantation, and (b) thereafter subjecting the substrate to a silane and ammonia plasma treatment to obtain formation of a silicon and nitrogen-containing layer which may be deemed a form of silicon nitride, i.e., hydrogenated silicon nitride, but is more accurately identified as a coating of $Si_xH_yN_z$ (polysilazane), where x and z each range from about 1.0 to about 1.3 and y ranges from about 0.05 to about 0.30. Additional hydrogen implantation occurs during the combined ammonia/silane treatment.

The $Si_xH_yN_z$ coating is a dielectric layer which (a) can be easily and precisely etched away from the substrate in the form of a selected metallization pattern without any significant etching of silicon, (b) can serve as a mask to permit selected metal plating for formation of electrodes and (c) can serve as an anti-reflection coating. More importantly, the hydrogen implantation resulting from the two-step plasma treatment enhances the conversion efficiency of the solar cell.

It has now been observed that portions of the silicon and nitrogen-containing layer may pop away from the substrate, or else pinholes may form in that layer, when the cell is heat-treated to alloy the aluminum coating to the substrate. It is believed (although no specific proof exists) that outgassing of hydrogen is responsible for the popping and pinholes, since the occurrence of popping and pinholes is usually accompanied by a substantial reduction in the conversion efficiency of the cells. The essence of this invention is the discovery that the popping and pinholes may be prevented by subjecting the substrate to a special surface etch treatment before the two-step plasma treatment used to form the polysilazane.

Referring now to the drawing, the preferred embodiment of the invention relates to the production of solar cells from EFG-grown P-type polycrystalline silicon ribbon. However, it is to be noted that the invention may be practiced using silicon ribbons or substrates produced by other methods, e.g., substrates produced from Czochralski (CZ) grown crystals.

As a first process requirement, a pre-cleaned silicon substrate in the form of a flat ribbon 2 is subjected to a phosphine diffusion calculated to produce a relatively shallow junction 4 at a first side (hereinafter the "front side") of the substrate, (i.e., a junction of between about 3000 and about 5000 Angstrom units deep), an N-type conductivity region 6, and a phosphosilicate glass 8. In this preferred embodiment of the invention, the other side (the "rear side") of the substrate is not masked off during the diffusion step, with the result that a second junction 4A of substantially like depth, another N-type conductivity region 6A, and a layer of phosphosilicate glass 8A are produced on that other side of the substrate. The diffusion is terminated by a furnace slow cooling step which serves as a gettering treatment to getter impurities at the surface of the ribbon where they can be removed by etching.

Preferably the phosphine diffusion step is carried out at a temperature of between about 800 degrees C. and 1000 degrees C., and the furnace cool gettering treatment involves cooling the ribbon substrate to a temperature of about 650 degrees over a period of between about 1.5 and about 3.0 hours. During the gettering treatment, the silicon substrate is typically exposed to an atmosphere of oxygen and nitrogen (preferably in about a 1:1 volume ratio) gas.

Next, the phosphosilicate glass layers 8 and 8A are etched away by immersing the substrate in a buffered solution of 10NH$_4$F(40%):1HF at a temperature of between about 25 degrees C. and about 40 degrees C.

The next step involves placing the substrate in the vacuum chamber of a plasma CVD apparatus, introducing a fluoride-containing gas mixture to the vacuum chamber, and establishing a plasma discharge through the gas mixture so as to produce an etching plasma that contacts the front side of the substrate. This etching treatment may be carried out at room temperature and long enough to etch away the entire top surface of the substrate to a depth of about 0.005 microns. This may be accomplished in about 1.0 minutes.

In the next step, the substrate is subjected to a two-step silicon nitride deposition process. The first step of the two step process involves placing the substrate in a plasma reaction chamber, and subjecting the substrate to an ammonia plasma at a selected temperature for a time sufficient to produce hydrogen implantation. Thereafter, the substrate is maintained in the plasma reaction chamber and subjected to a mixed plasma of ammonia and silane at a selected temperature for a time sufficient to produce additional hydrogen implantation and a polysilazane coating of suitable thickness on the silicon. In this 2-step silicon nitride deposition process, hydrogen is implanted via the front surface of the substrate through the shallow junction 4.

The two-step silicon nitride (polysilazane) deposition process is preferably carried out using a conventional parallel-plate electrode plasma-enhanced CVD apparatus.

More specifically, the two-step polysilazane process preferably involves the following steps: (1) loading the substrates onto the electrode surfaces (2) with the subtrates disposed in the vacuum chamber, heating the vacuum chamber to a selected temperature and maintaining that temperature throughout the following steps, (3) evacuating the chamber to a pressure of about 0.2 Torr or lower, (4) introducing ammonia gas to the vacuum chamber at a selected rate long enough (usually about 15 seconds) to equilibrate the pressure at about 1-2 Torr lower, (5) turning on RF power to the electrodes to produce an ammonia plasma, (6) after the RF power has equilibrated (usually within about 6-12 seconds), continuing ammonia plasma production for a period of time sufficient to produce implantation of hydrogen in the substrate, (7) introducing silane gas to the vacuum chamber while maintaining flow of ammonia gas, and (8) terminating RF power and ammonia and silane gas flow after a polysilazane coating of sufficient thickness has been formed on the substrate.

As used herein, the term "polysilazane" means a form of hydrogenated silicon nitride having a composition represented by the formula $Si_xH_yN_z$, where Si, N and H are silicon, nitrogen, and hydrogen, respectively, and x and z each range from about 1.0 to about 1.3 and y ranges from about 0.05 to about 0.30. This polysilazane ("silicon nitride") coating 10 differs from the polysilazane coating initially formed in the deposition process described in the Chaudhuri patent in that it is denser and its hydrogen content varies from about 5 to about 30 atomic percent, depending on the temperature at which it is formed. It has an etch rate of about 40 to about 100 Angstroms/minute in a buffered oxide etch such as a solution of HF and $NH_4F$, and is deposited in a relatively thin layer, i.e., between about 500 and about 1500 Angstroms thick.

The 2-step silicon nitride deposition process is conducted with the plasma reaction chamber heated to a temperature of between about 320 degrees C. and 500 degrees C. and with the electrodes energized by an RF power supply having a frequency in the range of 35 to 450 kilohertz. 300 watts to 800 watts of RF power is provided into the plasma discharge that is established in the gaps between the pairs of electrodes. The two-step process, i.e., steps (6) and (7) above, takes between 3.0 and 20 minutes to complete, with only ammonia and silane being introduced to the reactor.

Following completion of the 2-step silicon nitride deposition process, the next step involves coating the front side of the substrate with a negative photoresist 12 in a suitable manner e.g., by spraying. In the usual case, the photoresist is baked to drive off organic solvents in the resist. Typically, the baking is achieved by heating the photoresist to between 80 degrees and 100 degrees C. for between about 30 and about 60 minutes.

Then the photoresist is exposed to a suitable radiant energy source through a suitable grid pattern mask so that exposed portions of the resist will polymerize. Preferably the electrode pattern typically is similar to the multi-fingered pattern shown in U.S. Pat. No. 3,686,036. Then the resist is developed by contacting it with one or more suitable solutions, e.g., toluene and/or propanol, which serve to remove the unexposed portion of the resist, leaving the exposed portions 12A intact.

Next the substrate is subjected to a suitable buffered oxide etch such as a buffered solution of $10NH_4F(40\%):1HF$, so as to etch away the nitride in those regions where the resist has been removed and also to clean the rear side of the substrate.

The next step is removal of the remaining resist. This is achieved by contacting the substrate with a reactive solution that digests the resist without attacking the substrate.

Then the rear side of the substrate is coated with a layer 14 of a selected aluminum-containing paste 14 that preferably comprises aluminum powder in an organic vehicle which can be removed by evaporation or pyrolysis. This step is then followed by a second heating step. In this second heating step, the substrate is heated for about 0.5-2.0 minutes at a temperature of between about 700-800 degrees C. to remove any volatile or pyrolyzable organic components of the paste and also to alloy the aluminum in the paste to the silicon substrate. This alloying step causes the aluminum coating to alloy with the rear side of the substrate so as to convert the N-type region 6A to a P+ region 16 having a depth of between about 1 to about 3 microns. This same heating step has the effect of converting the polysilazane-type silicon nitride into a form of silicon nitride which is more nearly $Si_3N_4$ and denser and has a much slower etch rate that as originally deposited, typically about 20 or less Angstroms/per minute. This heating step also tends to drive the implanted hydrogen into the substrate. This improves the bulk characteristics of the substrate by decreasing recombination of the minority carriers that are produced in response to incident light.

At the end of the foregoing heating step, the substrate is treated to make the front surface exposed silicon pattern and the back surface aluminum solderable, for example, by plating with nickel, with the nickel layer 18 on the back side being applied over the entire area of the aluminum layer 14 and the nickel layer 20 on the front side being applied over those areas of the front surface from which the silicon nitride coating has been removed. Nickel is not deposited on the densified silicon nitride coating 10A remaining on the front side of the substrate. Plating of the nickel layers may be done in various ways. Preferably it is accomplished in accordance with a known electroless nickel plating process, e.g., a process of the type described in U.S. Pat. No. 4,321,283 of Kirit Patel et al.

After the nickel has been applied, the substrate is heated in nitrogen or hydrogen to a temperature and for a time sufficient to sinter the nickel layers and cause the nickel layer 20 on the front side of the substrate to react with the adjacent silicon to form a nickel silicide ohmic contact. Preferably the substrate is heated to a temperature of about 300 degrees C. for between about 15 and about 40 minutes. This provides a nickel silicide layer with a depth of about 300 Angstrom units. The nickel layer 18 on the rear side forms an alloy with the aluminum layer.

After sintering has been completed, the nickel is subjected to etching with nitric acid to remove excess nickel from both sides of the substrate. The densified silicon nitride film 10A is highly resistant to the nickel etch solution and thus serves as a mask to protect the underlying silicon when excess nickel is etched away.

Thereafter the nickel silicide and nickel/aluminum alloys may be further metallized to provide suitable conducting contacts. Preferably but not necessarily, this further metallization involves application of a second layer of nickel to the nickel layers on both sides of the substrate according to one of the methods known in the art. Immediately thereafter, one or more layers of copper are applied to the exposed nickel on both sides of the substrate so as to bond to the nickel layers and thereby protect them against oxidation. The copper may be applied by electrolytic plating. Thereafter the device may be subjected to other known treatments for known purposes, e.g., a layer of tin and solder may be applied successively over the previously applied metal layers.

The nickel etch removes excess nickel and also some of the nickel aluminum alloy formed on the rear side of the substrate during the sintering step. After the nickel etch step, the front side of the substrate is characterized by a nickel silicide along the entire expanse of the preselected electrode grid pattern, and an aluminum/nickel alloy layer overlying an aluminum electrode layer on the rear side of the substrate.

The silicon nitride remaining on the front side of the substrate serves as an effective anti-reflection coating.

Tests have shown that the best conversion efficiencies are achieved when the ammonia and ammonia/silane plasma treatments are carried out at a temperature of between about 320 and about 500 degrees C. Tests also have shown that best efficiencies are obtained when the ammonia plasma treatment is carried out for between about 1.0 and about 15 minutes, preferably between about 1.5 and about 10 minutes, before the ammonia/silane plasma treatment is initiated. While the ammonia plasma treatment may be carried out for more than 15 minutes, no further improvement in efficiency has been observed by extending the treatment.

The ammonia gas is preferably supplied undiluted to the reactor. The rate of flow of the ammonia depends upon the volume of the reactor chamber, but in any event must be enough to assure that a plasma can be sustained under the applied RF field and adequate hydrogen implantation occurs. The rate of flow of silane is preferably maintained so as to provide between about a 5:1 to about a 10:1 ammonia to silane volume flow ratio.

The ammonia/silane plasma treatment should be conducted for between about 1.0 to about 4.0 minutes, preferably for about 2.5 minutes, so as to get a polysilazane coating with a thickness between about 840 and 890 Angstroms. Thicknesses in this range are required for optimum anti-reflection properties of the polysilazane layer after it has been heat treated. The densified silicon nitride has a refractive index of 2.15.

Following is a specific example of the preferred mode of practicing the invention.

EXAMPLE

A substitute in the form of a silicon ribbon of P-type conductivity made by the EFG process, and having a conductivity of about 2 to 3 ohm-cm., is cleaned by etching it in a solution of $HNO_3:HF(1:1)$ for about 3 minutes at a temperature of about 25 degrees C. Thereafter the ribbon is placed in a diffusion furnace and exposed to a continuous flow of an atmosphere comprising oxygen, nitrogen, and a phosphorus source such as phosphine ($PH_3$) at a temperature of about 900 degrees C. for a period of approximately 30 minutes. Thereafter the flow of phosphine is terminated and the furnace is allowed to cool in an air (oxygen and nitrogen) atmosphere to a temperature of about 650 degrees C. over a period of about 1.5 hours, after which it is removed from the furnace.

In the diffusion furnace, the following reactions occur:

$Si(s) + O_2(g) \rightarrow SiO_2(s)$
$2PH_3(g) + 4O_2(g) \rightarrow P_2O_5(g) + 3H_2O(g)$
$P_2O_5(g) + SiO_2(s) \rightarrow (P_2O_5)_x(SiO_2)_y(s)$
$2P_2O_5(s) + 5Si(s) \rightarrow 4P(s) + 5SiO_2(s)$ where (g) and (s) indicate gaseous and solid states respectively.

The $(P_2O_5)_x(Si)_2)_y$ is a phosphosilicate glass. It is removed from both sides of the ribbon by submerging the latter in a buffered HF acid solution, e.g., $10NH_4F(40\%):1HF$, for a period of about 2 minutes.

Thereafter the ribbon substrate is placed in the reaction chamber of a conventional parallel-plate electrode plasma-enhanced CVD apparatus. The reaction chamber is evacuated to about 0.025 Torr. Then a mixture of oxygen and carbon tetrafluoride diluted with an inert gas is introduced to the reactor chamber, with the latter maintained at about room temperature, i.e., 25–30 degrees C. The mixture comprises by volume 3% $CF_4$, 0.5% $O_2$, and 96.5% Helium, and it is conducted through the reactor chamber at the rate of about 0.15 liters/minute. Then an RF power supply is coupled across the pairs of electrodes in the reactor chamber to establish a plasma discharge in the gaps between the electrodes. The RF power supply has a frequency of about 13,500 kilohertz and supplies about 1500 watts of average RF power into the plasma discharge established in the gaps between the confronting electrodes. This results in an etching of the front surface of the ribbon. This etching treatment is terminated after about 1.0 minutes, with the result that the etching away of the front surface has reduced the thickness of the substrate by about 0.005 microns.

Thereafter, the substrate is subjected to the two-step silicon nitride deposition process in a parallel-plate electrodes plasma-enhanced CVD reactor. The reactor chamber is evacuated to a pressure level of about 0.2 Torr and maintained there in a gaseous $N_2$ ambient while being heated to a temperature of 360 degrees C. Then ammonia gas is fed into the reactor so as to provide a pressure of approximately 1.0 Torr. When the pressure in the reaction chamber has equilibrated, the RF power supply is turned on to establish a plasma discharge through the ammonia gas. The RF power supply is operated at 150 kilohertz and is set to deliver about 580 watts average RF power to the plasma. Then, about 10 minutes later and with ammonia gas still flowing through the vacuum reaction chamber at its original rate, silane gas is introduced to the reactor at so as to give approximately a 10:1 volume ratio between the ammonia and silane gases. The average RF power input is maintained at about 580 watts. After about an additional 2.8 minutes has elapsed, the RF power supply is shut off and the gas flow is terminated. After the reactor chamber has been restored to normal ambient pressure, the ribbon substrate is removed from the reactor chamber. It has a polysilazane coating of about 850 Angstroms thick.

Thereafter a layer of a negative photoresist is applied to the front side of the ribbon. A preferred negative resist is marketed under the name of Dynachem. The photoresist is prebaked for about 40–60 minutes at a temperature of 80–90 degrees C. so as to cause it to adhere firmly to the silicon. This photoresist layer is then covered with a mask in the pattern of a multi-fingered grid electrode, e.g. an electrode having the form illustrated in U.S. Pat. No. 3,686,036. The grid mask is then irradiated with ultraviolet light for approximately 3 seconds so as to cause the illuminated portion of the photo-resist coating to polymerize. The photoresist is then developed by contact with toluene and/or propanol and/or other suitable chemicals. This development process removes those portions of the resist which have not been irradiated and hence have not polymerized.

After development of the resist, the ribbon is subjected to a buffered oxide etch consisting of a solution of HF and $NH_4F$. The etchant etches away the nitride on those portions of the front surface of the ribbon from which the resist has been removed. The silicon nitride has an etch rate of approximately 100 Angstroms per minute.

Thereafter the silicon ribbon is immersed in a sulfuric acid bath for about 3 minutes to strip away the remaining photoresist. The substrate is then washed with water and dried.

After removal of the remaining resist, the back side of the ribbon is coated with an aluminum paste comprising minute aluminum particles in a volatile organic vehicle that preferably is terpineol. The paste is applied as a relatively thin layer. Then the substrate is subjected to infra-red heating at a temperature of about 700–800 degrees C. or higher for about 1.0 minute to remove the organic component of the aluminum paste and alloy the remaining aluminum to the silicon. This alloying step causes the N-type region at the rear side of the ribbon to be converted to a P+ region 16 having a depth of about 1-3 microns.

Thereafter both sides of the silicon ribbon are coated with a layer of nickel in accordance with the method described in said U.S. Pat. No. 4,321,283. More specifically, both sides of the silicon ribbon are coated with a layer of nickel by immersing the ribbon in an aqueous bath of nickel chloride and ammonium fluoride at a pH of about 2.9 and approximately room temperature for about 2-4 minutes. Then the ribbon is subjected to sintering in a furnace at a temperature of about 300 degrees C. in a nitrogen atmosphere for a period of about 25 minutes, whereby the nickel layer 20 on the front side of the ribbon reacts with the adjacent exposed silicon to form a nickel silicide ohmic contact, and nickel layer 18 on the back side forms an alloy with the underlying aluminum layer 14. It is to be noted that no nickel layer is deposited on the silicon nitride 10A remaining on the front side of the ribbon.

The ribbon is then immersed in an etching solution consisting of $HNO_3$ and kept there for a period of approximately 1-2 minutes so as to remove excess nickel from both sides of the ribbon. On removal from this bath the nickel on the front side of the ribbon is essentially all in the form of a nickel silicide.

After removal from the nickel etchant the ribbon is again subjected to ultrasonic cleaning in water to remove all residues. Then a second nickel plating composition is applied to the metallized portions of both sides of the ribbon according to the method described above for the initial nickel plating.

As soon as possible after the second nickel plating step has been completed, a layer of electroless copper is applied to the metallized portions of the two sides of the ribbon. This is followed by a second layer of electrolytically deposited copper applied to the metallized portions of both sides of the ribbon. Then a layer of tin is electrolytically deposited onto each copper layer by immersing the ribbon in an electrolytic tin bath.

Thereafter the finished cell is dipped in a solder bath comprising 62% tin, 36% lead and 2% silver so as to apply a solder layer over the tin coatings.

It has been determined that solar cells made according to the foregoing example from EFG grown ribbons routinely exhibit conversion efficiencies in the range of 12.5%-16%. The silicon nitride remaining on the front side of the finished devices serves as an effective anti-reflection coating.

It is to be noted that with this invention, the silicon nitride coating does not pop or develop pinholes, nor does it crack, as a consequence of the thermal treatment involved in the aluminum alloying step. Consequently the yield on a production line basis of solar cells with conversion efficiencies of 12.5% to 16.0% is increased substantially by this invention.

This invention retains a number of the advantages of the process described in U.S. Pat. No. 4,451,969 and said copending PCT application No. 01/701622 of A. Chaudhuri et al., filed on even date herewith. Thus the silicon nitride coating functions as both a plating mask and a very effective anti-reflection coating. Also the silicon nitride coating is deposited, rather than formed by conversion of a heavily doped, i.e., high conductivity N+ silicon, as occurs, for example, when an anti-reflection coating is formed by chemical staining which converts silicon to an oxide fluoride stain A/R coating or when a silicon nitride anti-reflection coating is formed by thermal nitridation (see U.S. Pat. No. 4,226,985 for formation of direct thermal nitride films).

Of course, the process provided by this invention is not limited to the production of solar cells from EFG substrates. Thus, for example, silicon substrates derived from CZ grown boules or grown from the melt by a method other than EFG also may be used to form relatively high efficiency solar cells according to the present invention. Also the invention may be applied to silicon substrates which are not ribbons or are not flat, e.g., circular pieces of silicon or silicon in forms having an arcuate or polygonal cross-sectional shape.

The process steps herein described may be used in the manufacture of other kinds of semiconductor devices.

A further obvious modification is to mask the rear side of the substrate during the diffusion junction formation step, so as to prevent formation of back junction 4A and the N-type region 6A. In such case a P+ region as shown at 16 is still produced when the aluminum layer 14 is alloyed to the silicon substrate.

It also is to be understood that etching of the polysilazane coating to form a suitable grid electrode pattern may be carried out without photolithography, e.g., by use of plasma or laser etching techniques.

The surface treatment is not restricted to use of $O_2$ and $CF_4$, but instead may be carried out using a mixture comprising by volume 65% $C_2F_6$ and 35% $O_2$, with no need for an inert carrier gas. This alternative etching gas treatment also is carried out at about room temperature, i.e., 25-30 degrees C., with similar success in eliminating the popping and pin holes that tend to occur if no plasma surface etch treatment is carried out. Use of this alternative etching process at an elevated temperature such as 300 degrees C. will not eliminate the popping or pin hole phenomenon.

Still other changes may be made without departing from the principles of the invention as, for example, forming the P+ back region of the cell by using flame sprayed aluminum instead of an aluminum paint or using different methods of applying the second and subsequent coatings of nickel and/or coating(s) of copper, or forming the junction by ion implantation. Also it is contemplated that silver or some other conducting and solderable metal may be used in place of nickel to form an ohmic contact. Also the method of this invention may be practiced using various types of conventional parallel-plate-electrodes plasma-enhanced CV machines.

What is claimed is:
1. Method of fabricating solid state semiconductor devices comprising:
   (a) providing a silicon substrate having first and second opposite surfaces;
   (b) forming a P/N junction in said substrate adjacent to said first surface;
   (c) subjecting said first surface to a plasma surface treatment so as to etch away a portion of said first surface;
   (d) subjecting said first surface to a plasma treatment involving (a) an ammonia plasma for producing hydrogen implantation and (b) a combined silane and ammonia plasma treatment for producing additional hydrogen implantation and formation of a polysilazane coating;
   (e) etching a predetermined two-dimensional pattern in said polysilazane coating so that selected portions of said first surface are not covered by said polysilazane coating;

(f) applying a coating of aluminum to said second opposite surface;

(g) heating said silicon substrate to a temperature and for a time sufficient to cause the aluminum constituent of said aluminum coating to alloy with said silicon substrate; and (h) applying a conductive metal coating to said selected portions of said first surface and said aluminum coating.

2. Method according to claim 1 further including the step of sintering said conductive metal coating so that said conductive metal and silicon will bond together to form a metal silicide at their interface.

3. Method according to claim 1 wherein said plasma surface etch treatment involves subjecting said first surface to a fluorine-containing plasma.

4. Method according to claim 1 wherein step (g) results in densifying said polysilazane coating so that it has a lower etch rate in a selected etchant.

5. Method according to claim 1 wherein step (g) also results in driving the implanted hydrogen further into the substrate.

6. Method according to claim 1 wherein step (c) is conducted at room temperature.

7. Method according to claim 6 wherein said surface etch treatment involves contacting said first surface with a fluorine-containing plasma comprising $O_2$, $CF_4$, and an inert gas.

8. Method according to claim 6 wherein said surface etch treatment involves contacting said first surface with a fluorine-containing plasma comprising $O_2$ and $C_2F_6$.

9. Method according to claim 1 wherein said first surface of said substrate is etched away to a depth of about 0.005 microns.

10. Method according to claim 1 wherein said surface etch treatment involves contacting said first surface with a fluorine-containing plasma comprising $0_2$ and either $CF_4$ or $C_2F_6$.

11. Method of fabricating solid state semiconductor devices comprising:

(a) providing a silicon substrate having first and second opposite surfaces;

(b) forming a P/N junction in said substrate adjacent to said first surface;

(c) subjecting said first surface to a plasma surface etch treatment involving a plasma mixture of $O_2$ and either $CF_4$ or $C_2F_6$;

(d) subjecting sard first surface to a further plasma treatment involving (a) an ammonia plasma so as to produce hydrogen implantation and (b) a combined silane and ammonia plasma treatment so as to produce additional hydrogen implantation and formation of a polysilazane coating characterized by the formula $Si_xH_yN_z$;

(e) covering said polysilazane coating with an adherent coating of a photoresist material;

(f) exposing said photoresist coating to radiant energy through a mask defining a predetermined two-dimensional pattern;

(g) chemically developing said photoresist so that selected portions of said resist are removed from said polysilazane coating according to said predetermined patterns;

(h) removing those portions of said polysilazane coating which are not covered by said photoresist so that selected portions of said first surface are exposed to the atmosphere;

(i) applying a coating of aluminum to said second opposite surface;

(j) heating said silicon substrate to a temperature and for a time sufficient to cause the aluminum constituent of said aluminum coating to alloy with said silicon substrate and to drive the implanted hydrogen further into the substrate; and (k) applying a coating of a conductive and solderable metal to said selected portions of said first surface and said aluminum coating.

12. Method according to claim 11 wherein said first plasma surface treatment involves use of a plasma comprising oxygen and $CF_4$.

13. Method according to claim 11 wherein said first plasma treatment involves use of a plasma comprising $O_2$ and $C_2F_6$.

14. Method according to claim 11 wherein the polysilazane coating has a thickness of between about 840 and about 890 Angstroms.

15. Method according to claim 11 wherein the polysilazane coating has a refractive index of 2.15 after step (j).

16. Method according to claim 11 wherein said polysilazane coating is represented by the formula $Si_xH_yN_z$, where x and z each range from about 1.0 to about 1.3, and y ranges from about 0.05 to about 0.30.

17. Method of fabricating solid state semiconductor devices comprising:

(a) providing a silicon substrate having first and second opposite surfaces;

(b) forming a P/N junction in said substrate adjacent said first surface;

(c) subjecting said first surface to a plasma surface etch treatment involving a plasma mixture comprising $O_2$ and at least one member of the class consisting of $CF_4$ and $C_2F_6$ so as to etch away a portion of said first surface;

(d) subjecting said first surface to a plasma treatment involving (a) an ammonia plasma for producing hydrogen implantation and (b) a combined silane and ammonia plasma treatment for producing additional hydrogen implantation and formation of a polysilazane coating;

(e) covering said polysilazane coating with an adherent coating of a photoresist material;

(f) exposing said photoresist coating to radiant energy through a mask defining a predetermined two-dimensional pattern;

(g) chemically developing said photoresist so that selected portions of said resist are removed from said polysilazane coating according to said predetermined patterns;

(h) removing those portions of said polysilazane coating which are not covered by said photoresist so that selected portions of said first surface are exposed to the atmosphere;

(i) applying a coating of aluminum to said second opposite surface;

(j) heating said silicon substrate to a temperature and for a time sufficient to cause the aluminum constituent of said aluminum coating to alloy with said silicon substrate;

(k) applying a nickel coating to said selected portions of said first surface; and (l) sintering said nickel coating so that the nickel and silicon react to form a nickel silicide at their interface; whereby said polysilazane coating has a refractive index of about 2.15.

* * * * *